United States Patent [19]

Kamuro

[11] Patent Number: 5,166,551
[45] Date of Patent: Nov. 24, 1992

[54] HIGH SPEED OUTPUT CIRCUIT WITHOUT FLUCTUATION FOR SEMICONDUCTOR INTEGRATED CIRCUITS

[75] Inventor: Setsufumi Kamuro, Matsudo, Japan

[73] Assignee: Sharp Kabushiki Kaisha, Osaka, Japan

[21] Appl. No.: 628,906

[22] Filed: Dec. 18, 1990

[30] Foreign Application Priority Data

Dec. 22, 1989 [JP] Japan .................. 1-333894

[51] Int. Cl.$^5$ .......................................... H03K 19/013
[52] U.S. Cl. .................................. 307/446; 307/443; 307/451; 307/542; 307/456
[58] Field of Search .............. 307/443, 446, 451, 542, 307/548, 558, 568, 456, 458

[56] References Cited

U.S. PATENT DOCUMENTS

| | | | |
|---|---|---|---|
| 4,661,727 | 4/1987 | Ferris et al. | 307/456 |
| 4,731,553 | 3/1988 | Van Lehn et al. | 307/443 |
| 4,737,665 | 4/1988 | Ovens | 307/456 |
| 4,740,719 | 4/1988 | Taki | 307/456 |
| 4,918,339 | 4/1990 | Shigeo et al. | 307/542 |
| 4,961,010 | 10/1990 | Davis | 307/443 |
| 5,003,205 | 3/1991 | Kohda et al. | 307/451 |

Primary Examiner—Janice A. Howell
Assistant Examiner—Scott A. Ouellette
Attorney, Agent, or Firm—Nixon & Vanderhye

[57] ABSTRACT

An output circuit for semiconductor integrated circuit includes an input terminal, an output terminal, a supply terminal, first and second transistors, and first and second drive circuits. One terminal of the first and second transistors are coupled to the power voltage terminal, and the other terminals thereof are coupled to the output terminal. The first drive circuit turns on the first transistor when voltage of the input terminal is in a different logical level from voltage of the supply terminal. The second drive circuit turns on the second transistor when voltage of the input terminal is in a different logical level from the voltage of the supply terminal, and turns off the second transistor when voltage of the output terminal is in the range between a predetermined threshold voltage and the voltage of the supply terminal.

17 Claims, 7 Drawing Sheets

HIGH SPEED OUTPUT CIRCUIT WITHOUT FLUCTUATION FOR SEMICONDUCTOR INTEGRATED CIRCUITS

BACKGROUND OF THE INVENTION

1. Field of the Invention

The present invention relates to an output circuit for a semiconductor integrated circuit using digital signals.

2. Description of the Related Art

Recently, the operation speed of semiconductor integrated circuits such as memories is getting faster and faster. Therefore, high speed pulse signals which are output from the output stage tend to suffer from a high range distortion such as an undershoot and/or overshoot. When the undershoot and/or overshoot takes place, the voltage on the power supply voltage line and the ground line fluctuates excessively and thereby causes troubles such as noise and malfunction.

As shown in FIG. 1, an output circuit known to the inventor has an inverter 14 which consists of a PMOS (P-channel type Oxide Semiconductor) transistor 10 and an NMOS (N-channel type Oxide Semiconductor) transistor 12, an inverter 20 which consists of a PMOS transistor 16 and NMOS transistor 18, an drive PMOS transistor 22, a drive NMOS transistor 24, input terminals 26 and 28, power supply voltage terminals 30 and 32, and a output terminal 34.

The two inverters 14 and 20 are connected to the MOS transistors 22 and 24, respectively. A power is supplied to the source of the MOS transistor 22, the source of the MOS transistor 24 being grounded. The connecting point between the MOS transistors 22 and 24 is connected to the output terminal 34. When digital signals having the same phase with each other are sent to the input terminals 26 and 28 respectively, a signal having the same phase as the input signals is output from the output terminal 34.

However, in the output circuit shown in FIG. 1, when input signals to the two MOS transistors 22 and 24 changes from H (high) level to L (low) level or vice versa, the undershoot and/or overshoot takes place.

To remove such the undershoot and/or overshoot, the output circuit is structured as shown in FIG. 2. In other words, it is necessary to place resistors 36 and 38 between the inverters 14 and 20 and between the MOS transistors 22 and 24, respectively. The resistors 36 and 38 allow the through rate of signals from the input terminals 26 and 28 to be decreased and thereby preventing the voltage which is output from the output terminal 34 from abruptly changing.

However, in case that the undershoot and/or overshoot is suppressed with such resistors, since the output signal is delayed, it is difficult to increase the speed of the signal.

SUMMARY OF THE INVENTION

Accordingly, an object of the present invention is to provide an output circuit for semiconductor integrated circuit capable of outputting signals at a high speed without inviting an undershoot and/or overshoot.

To accomplish the above object, the output circuit for semiconductor integrated circuit includes an input terminal, an output terminal, a supply terminal for supplying a power supply voltage or a ground voltage, first and second transistors, and first and second drive circuits. One terminal of the first and second transistors is coupled to the supply terminal, and the other terminals thereof are coupled to the output terminal. The first drive circuit is coupled to the first transistor, and turns on the first transistor when voltage of the input terminal is in a different logical level from voltage of the supply terminal. The second drive circuit is coupled to the input terminal, to the output terminal, and to the second transistor. This second drive circuit turns on the second transistor when voltage of the input terminal is in a different logical level from the voltage of the supply terminal, and turns off the second transistor when voltage of the output terminal is in the range between a predetermined threshold voltage and the voltage of the supply terminal.

When the voltage of the input terminal is in a different logical level from the voltage of the supply terminal, the first and second transistors are turned on. Thus, since the resistance between the supply terminal and the output terminal decreases, a signal which is sent to the input terminal is output at a high speed and thereby the through rate increases. On the other hand, when the voltage of the output terminal is in the range between the predetermined threshold voltage and the voltage of the supply terminal, the second transistor is turned off. Thus, the resistor between the supply terminal and the output terminal increases and thereby the through rate decreases. Consequently, according to the present invention, in the simple circuit structure, the operation speed can be kept high while preventing the undershoot and/or overshoot of the output signal.

It is preferable that the first and second transistors are MOS transistors.

It is preferable that the first and second transistors are PMOS transistors, drain and source thereof being connected to the output terminal and the supply terminal for supplying a power supply voltage, respectively.

It is preferable that the first and second transistors are NMOS transistors, the drain and source thereof being connected to the output terminal and the supply terminal for supplying a ground voltage, respectively.

It is possible that the first and second transistor are bipolar transistors.

It is preferable that the first and second transistors are PNP transistors, collector and the emitter thereof being connected to the output terminal and the supply terminal for supplying the power supply voltage, respectively.

The second drive circuit for driving the second PNP transistor may be formed by means of MOS transistor technology.

The second drive circuit for driving the second PNP transistor may be formed by means of BiMOS transistor technology.

The second drive circuit for driving the second PNP transistor may be formed by means of bipolar transistor technology.

It is preferable that the first and second transistors are NPN transistors, collector and emitter thereof being connected to the output terminal and the supply terminal for supplying the ground voltage, respectively.

The second drive circuit for driving the second NPN transistor may be formed by means of the MOS transistor technology.

The second drive circuit for driving the second NPN transistor may be formed by means of the BiMOS transistor technology.

The second drive circuit for driving the second NPN transistor may be formed by means of the bipolar transistor technology.

To further accomplish the above object, the output circuit for semiconductor integrated circuit includes an input terminal, an output terminal, a power voltage terminal, first to fourth transistors, and first to fourth drive circuits. One terminals of the first and second transistors are coupled to the power voltage terminal and the other terminals thereof are coupled to the output terminal. The first drive circuit is coupled to the first transistor, and turns on the first transistor when voltage of the input terminal is in a different logical level from a power supply voltage. The second drive circuit is coupled to the input terminal, to the output terminal, and to the second transistor. This second drive circuit turns on the second transistor when voltage of the input terminal is in a different logical level from the power supply voltage, and turns off the second transistor when voltage of the output terminal is in the range between a predetermined threshold voltage and the power supply voltage. One terminal of the third and fourth transistors is coupled to the ground, and the other terminals thereof are coupled to the output terminal. The third drive circuit is coupled to the input terminal and to the third transistor. This third drive circuit turns on the third transistor when voltage of the input terminal is in a different logical level from the voltage of the ground. The fourth drive circuit is coupled to the input terminal, to the output terminal, and to the fourth transistor. This fourth drive circuit turns on the fourth transistor when voltage of the input terminal is in a different logical level from the ground voltage and turns off the fourth transistor when voltage of the output terminal is in the range between a predetermined threshold voltage and the ground voltage.

It is preferable that the first to fourth transistors are MOS transistor.

It is preferable that the first and second transistor are PMOS transistors, drain and source thereof being connected to the output terminal and the power voltage terminal, respectively, and that the third and fourth transistors are NMOS transistors, drain and source thereof being connected to the output terminal and the ground, respectively.

It is preferable that the first to fourth transistors are bipolar transistors.

It is preferable that the first and second transistors are PNP transistors, collector and emitter thereof being connected to the output terminal and the power voltage terminal, respectively, and that the third and fourth transistor are NPN transistors, collector and emitter thereof being connected to that output terminal and the ground, respectively.

The third and fourth transistor may be Schottky NPN transistors, the collector and the emitter thereof being connected to the output terminal and the ground, respectively.

Further objects and advantages of the present invention will be apparent from the following description of the preferred embodiments of the invention as illustrated in the accompanying drawings.

DESCRIPTION OF THE PREFERRED EMBODIMENT

Figure 2:
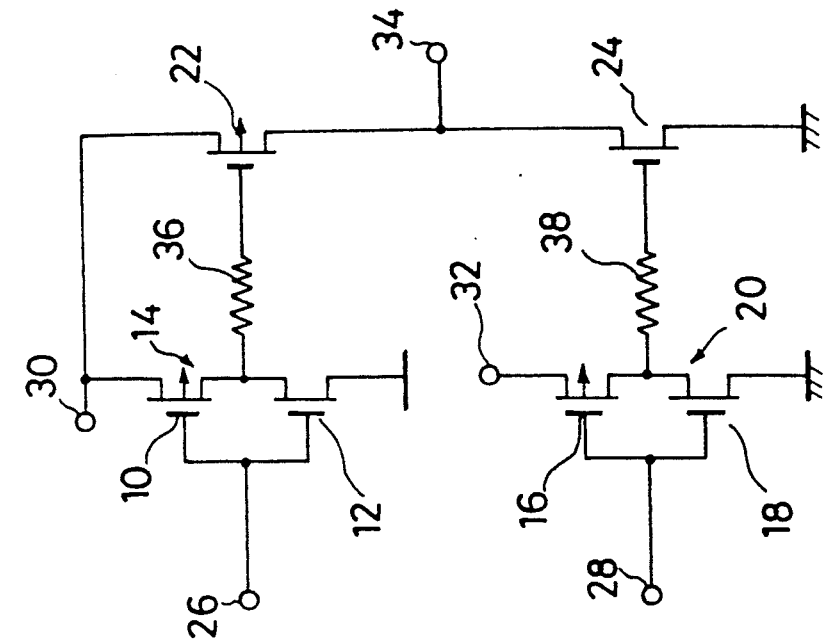
FIG. 2 schematically shows an electrical structure of another output circuit known to the inventor.
Figure 1:
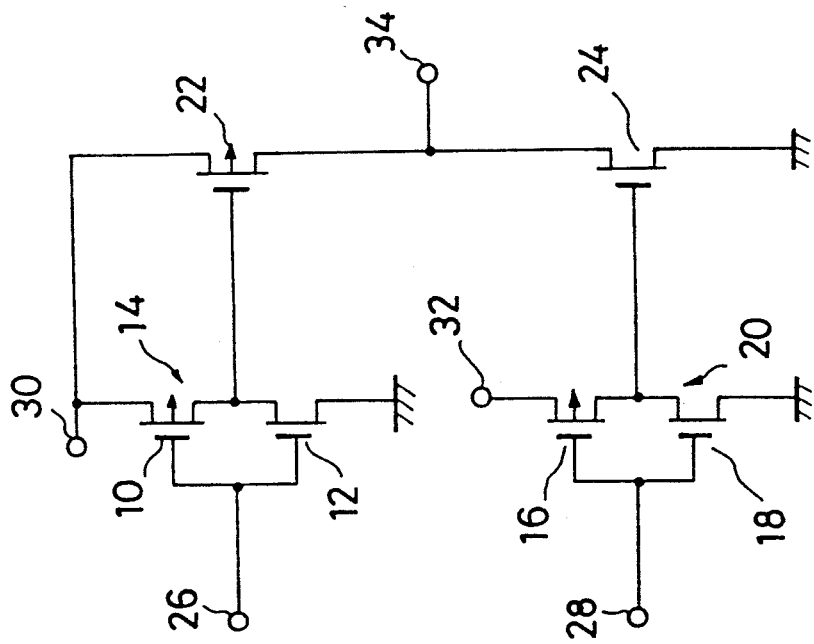
FIG. 1 schematically shows an electrical structure of an output circuit known to the inventor.
Figure 3:
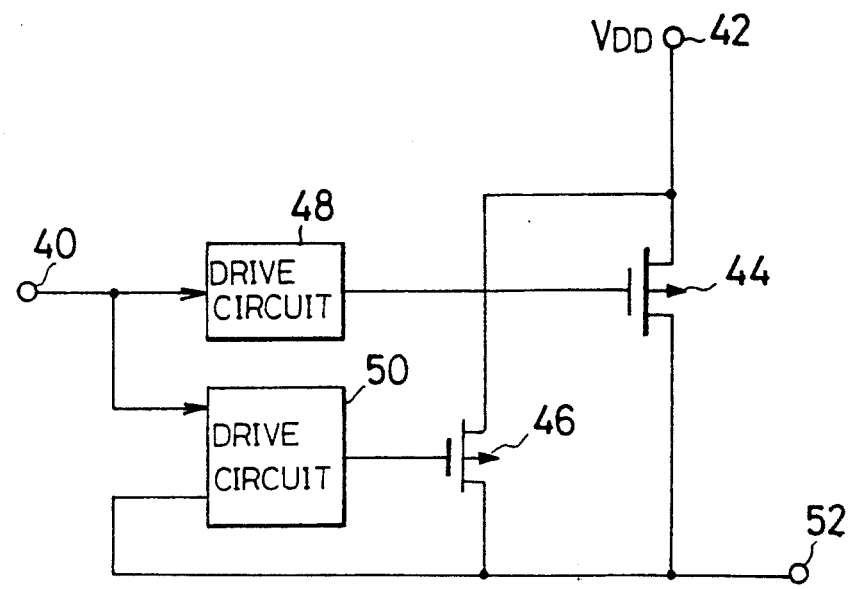
FIG. 3 schematically shows an electrical structure of a first embodiment of an output circuit according to the present invention.

FIG. 3 schematically shows an electrical structure of a preferred first embodiment of an output circuit for semiconductor integrated circuit according to the present invention.

The output circuit according to the first embodiment is used for an output stage for a high speed memory such as PROM (Programmable Read Only Memory). The circuit of this embodiment is basically constituted by combination of an input terminal 40, a supply terminal 42, for supplying a power voltage MOS transistors 44 and 46, drive circuits 48 and 50 for driving the MOS transistors 44 and 46, and an output terminal 52.

The input terminal 40 is connected to the drive circuits 48 and 50. The drive circuits 48 and 50 are connected to the MOS transistors 44 and 46, respectively. Each source of the MOS transistors 44 and 46 is connected to the supply terminal 42, and drains thereof are connected to the output terminal 52. The output terminal 52 is also connected to the drive circuit 50.

In this embodiment, the MOS transistors 44 and 46 are PMOS transistors. A power supply voltage $V_{DD}$ is supplied to the supply terminal 42. A digital signal is applied to the input terminal 40. The drive circuit 48 applies to a gate of the MOS transistor 44 a voltage in the same logical level as the signal applied to the input terminal 40. Thus, when the voltage of the input terminal 40 is in the H level, the MOS transistor 44 is in off state. When the voltage is in the L level, the MOS transistor 44 is in on state.

When the voltage of the input terminal 40 is in the H level, the drive circuit 50 applies to a gate of the MOS transistor 46 a voltage in the same logical level (H level) as the voltage of the input terminal 40. Thus, in this case, the MOS transistor 46 is in off state. When the voltage of the input terminal 40 is in the L level, the drive circuit 50 applies to the gate of the MOS transistor 46 the voltage of the output terminal 52. In other words, when the voltage of the output terminal 52 increases from the L level to the H level and the voltage of the output terminal 52 is $(V_{DD}-|V_{THP}|)$ or less, the MOS transistor 46 is turned on, where the voltage of the supply terminal 42 is $V_{DD}$ and the threshold voltage of the PMOS transistor 46 is $V_{THE}$. Thus, in this case, both the MOS transistors 44 and 46 are in on state and thereby they are connected in parallel. When the voltage of the output terminal 52 increases higher than $(V_{DD}-|V_{THP}|)$, the MOS transistor 46 is turned off. When the voltage of the output terminal 52 is low, both the MOS transistors 44 and 46 are in on state. Thus, the voltage of the output terminal 52 is increased rapidly toward the power supply voltage $V_{DD}$. Consequently, the rising speed of the output signal is increased. As the voltage of the output terminal 52 increases, the gate voltage of the MOS transistor 46 also increases. Thus, the drive performance of the MOS transistor 46 gradually becomes weak. Finally, when the voltage of the output terminal 52 increases higher than $(V_{DD}-|V_{THP}|)$, MOS transistor 46 is turned off. At that time, only the MOS transistor 44 is in on state causing the voltage of the output terminal 52 to be increased toward the power supply voltage $V_{DD}$. Thus, the overshoot which takes place when the output signal rises can be prevented.

Figure 4:
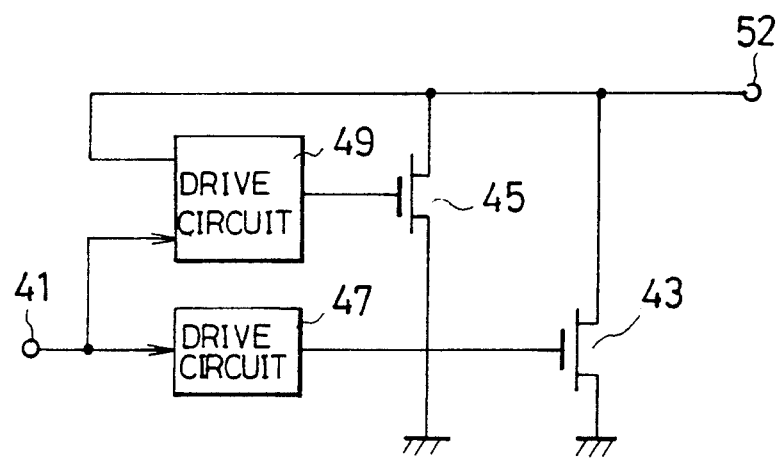
FIG. 4 schematically shows an electrical structure of a second embodiment of an output circuit according to the present invention.

FIG. 4 schematically shows an electrical structure of a preferred second embodiment of an output circuit for semiconductor integrated circuit according to the present invention.

Like the first embodiment shown in FIG. 3, the circuit according to the second embodiment is basically constituted by combination of an input terminal 41, MOS transistors 43 and 45, drive circuits 47 and 49 for driving the MOS transistors 43 and 45, and an output terminal 52.

The input terminal 41 is connected to the drive circuits 47 and 49. The drive circuits 47 and 49 are connected to the MOS transistors 43 and 45, respectively. Each source of the MOS transistors 43 and 45 are connected to the ground, and drains thereof are connected to the output terminal 52. The output terminal 52 is also connected to the drive circuit 49.

In the second embodiment, the MOS transistors 43 and 45 are NMOS transistors. A digital signal is applied to the input terminal 41. The drive circuit 47 applies to a gate of the MOS transistor 43 a voltage in the same logical level as the signal applied to the input terminal 41. Thus, when the voltage of the input terminal 41 is in the L level, the MOS transistor 43 is in off state. When the voltage of the input terminal 41 is in the H level, the MOS transistor 43 is in on state.

When the voltage of the input terminal 41 is in the L level, the drive circuit 49 applies to a gate of the MOS transistor 45 a voltage in the same logical level (L level) as the voltage of the input terminal 41. Thus, in this case, the MOS transistor 45 is in off state. When the voltage of the input terminal 41 is in the H level, the drive circuit 49 applies to the gate of the MOS transistor 45 the voltage of the output terminal 52. In other words, when the voltage of the output terminal 52 decreases from the H level to the L level and the voltage of the output terminal 52 increases higher than the threshold voltage $V_{THN}$ of the MOS transistor 45, the MOS transistor 45 is turned on. Thus, in this case, both the MOS transistors 43 and 45 are in on state and thereby they are connected in parallel. When the voltage of the output terminal 52 decreases lower than the threshold voltage $V_{THN}$, the MOS transistor 45 is turned off. Thus, when the voltage of the output terminal 52 is high, both the MOS transistors 43 and 45 are in on state. Consequently, the voltage of the output terminal 52 is rapidly decreased toward the ground voltage. Thus, the speed of the falling output signal is increased. As the voltage of the output terminal 52 decreases, the gate voltage of the MOS transistor 45 also decreases. Consequently, the drive performance of the MOS transistor 45 gradually becomes weak. Finally, when the voltage of the output terminal 52 is lower than the threshold voltage $V_{THN}$, the MOS transistor 45 is turned off. At that time, only the MOS transistor 43 is in on state causing the voltage of the output terminal 52 to be decreased toward the ground voltage. Consequently, the undershoot which takes place when the output signal falls can be prevented.

Figure 5:
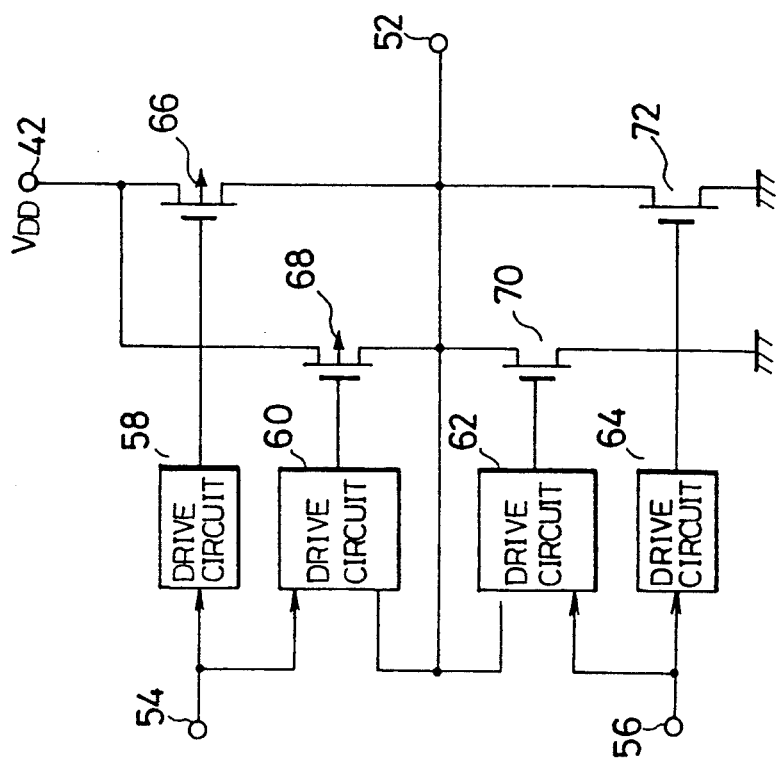
FIG. 5 schematically shows an electrical structure of a third embodiment of an output circuit according to the present invention.

FIG. 5 schematically shows an electrical structure of a preferred third embodiment of an output circuit for semiconductor integrated circuit according to the present invention. The third embodiment is structured by coupling the electric circuit shown in FIG. 3 and that shown in FIG. 4.

The output circuit of the third embodiment is generally constituted by two input terminals 54 and 56, a common output terminal 52, four drive circuits 58, 60, 62 and 64, PMOS transistors 66 and 68, and NMOS transistors 70 and 72.

The input terminal 54 is connected to the drive circuits 58 and 60. The drive circuits 58 and 60 are connected to the PMOS transistors 66 and 68, respectively. A source of each of the PMOS transistors 66 and 68 is connected to the supply terminal 42 of the power supply voltage $V_{DD}$, and drains thereof are connected to the output terminal 52.

Likewise, the input terminal 56 is connected to the drive circuits 62 and 64. The drive circuits 62 and 64 are connected to the NMOS transistors 70 and 72, respectively. A source of each of the NMOS transistors 70 and 72 is grounded and drains thereof being connected to the output terminal 52.

A digital signal is applied to the input terminals 54 and 56. When the voltage of the input terminal 54 is in the L level, like the first embodiment shown in FIG. 3, the voltage of the output terminal 52 is applied to the gate of the PMOS transistor 68. When the voltage of the output terminal 52 increases from the L level to the H level, the following operation takes place. When the voltage of the output terminal 52 is lower than $(V_{DD}-|V_{THP}|)$, both the PMOS transistors 66 and 68 are in on state and thereby the voltage of the output terminal 52 is increases rapidly toward the power voltage $V_{DD}$, where $V_{DD}$ is the voltage of the supply terminal 42, and $V_{THP}$ is the threshold voltage of the PMOS transistor 68. As the voltage Of the output terminal 52 increases, the gate voltage of the PMOS transistor 68 also increases. Thus, the drive performance of the PMOS transistor 68 gradually becomes weak. When the voltage of the output terminal 52 increases higher than $(V_{DD}-|V_{THP}|)$, the PMOS transistor 68 is turned off. Thus, only the PMOS transistor 66 is in on state. When the voltage of the output terminal 52 is lower than $(V_{DD}-|V_{THP}|)$, the resistance between the supply terminal 42 and the output terminal 52 becomes low. Thus, the through rate of the output signal increases and thereby this output circuit can respond to a high speed signal. When the voltage of the output terminal 52 is higher than $(V_{DD}-|V_{THP}|)$, the resistance between the supply terminal 42 and the output terminal 52 becomes high. Thus, the through rate decreases and thereby the overshoot can be prevented. Consequently, the speed of the rising output signal can be increased with preventing the overshoot from taking place.

When the voltage of the input terminal 56 is in the H level, like the second embodiment shown in FIG. 4, the voltage of the output terminal 52 is applied to the gate of the NMOS transistor 70. When the voltage of the output terminal 52 decreases from the H level to the L level, the following operation takes place. When the voltage of the output terminal 52 is higher than the threshold voltage $V_{THN}$ of the NMOS transistor 70, the MOS transistor 70 is in on state. Thus, in this case, both the MOS transistors 70 and 72 are in on state and thereby the voltage of the output terminal 52 is rapidly decreased toward the ground voltage. As the voltage of the output terminal 52 decreases, the gate voltage of the NMOS transistor 70 decreases. Thus, the drive performance of the NMOS transistor 70 gradually becomes weak. Finally, when the voltage of the output terminal 52 is lower than the $V_{THN}$, the MOS transistor 70 is turned off, and only the NMOS transistor 72 is in on state. Thus, when the voltage of the output terminal 52 is higher than the threshold voltage $V_{THN}$, since the resistance between the output terminal 52 and the ground becomes low, the through rate of the output signal increases. Thus, this output circuit can be respond to a high speed signal. When the voltage of the output terminal 52 is lower than the threshold voltage $V_{THN}$, the resistance between the output terminal 52 and the ground becomes high. Thus, the through rate decreases and thereby the undershoot can be prevented. Consequently, the speed of the falling output signal can be increased with preventing the undershoot from taking place.

Figure 6:
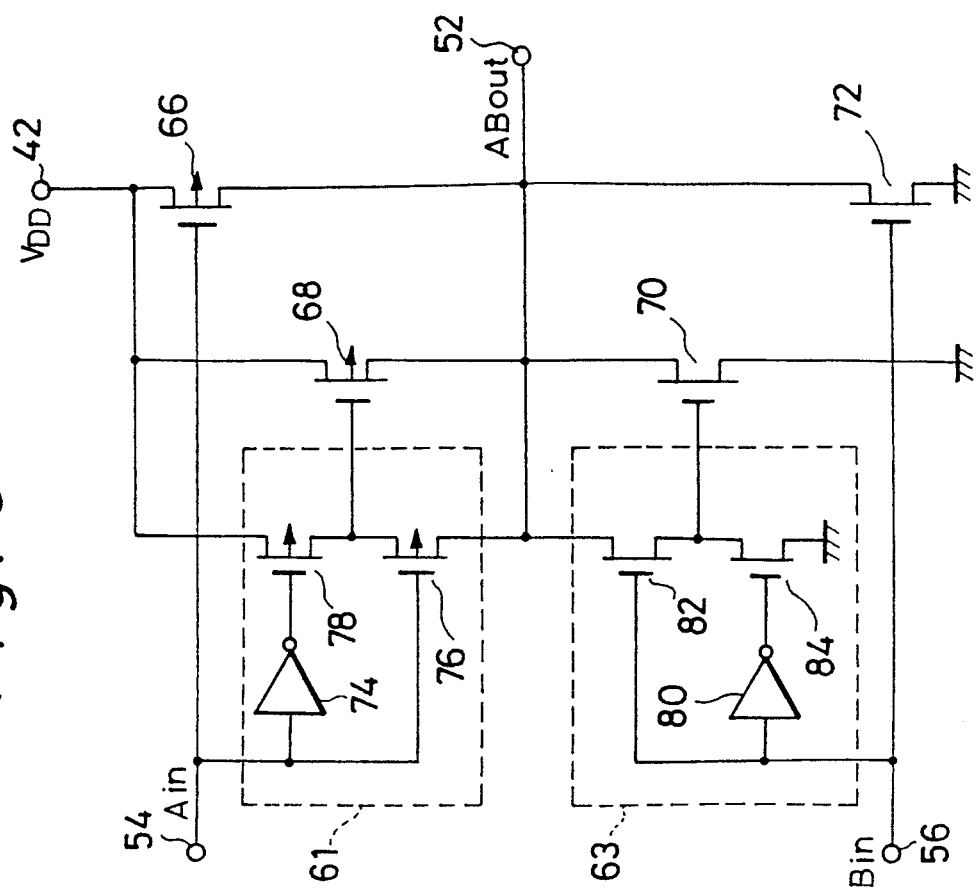
FIG. 6 shows a detail circuit of the third embodiment shown in FIG. 5.

FIG. 6 is a detail circuit of the third embodiment shown in FIG. 5.

In the third embodiment, the drive circuits 58 and 64 (FIG. 5) are shown by simple lines. The input terminals 54 and 56 are directly connected to the gates of the PMOS transistors 66 and 72, respectively. The drive circuits 60 and 62 (FIG. 5) accord with dot line sections 61 and 63, respectively. The input terminal 54 is connected to an inverter 74 and a PMOS transistor 76 of the drive circuit shown by the dot line section 61. The output terminal of the inverter 74 is connected to the PMOS transistor 78. The PMOS transistors 76 and 78 are connected in series. A source of the PMOS transistor 78 is connected to the supply terminal 42. The connecting point of the two PMOS transistors 76 and 78 is connected to the gate of the PMOS transistor 68.

The input terminal 56 is connected to an inverter 80 and an NMOS transistor 82 of the drive circuit shown by the dot line section 63. The output terminal of the inverter 80 is connected to the NMOS transistor 84. The NMOS transistors 82 and 84 are connected in series. A source of the NMOS transistor 84 is connected to the ground. The connecting point of the two NMOS transistors 82 and 84 is connected to the gate of the NMOS transistor 70. The connecting point of the PMOS transistor 68 and the NMOS transistor 70 is connected to the output terminal 52.

When the signal level of the input terminals 54 and 56 is satisfactorily high, the drive circuits 58 and 64 (FIG. 5) can be structured as shown by the simple lines according to the third embodiment. However, when the signal level of the input terminals 54 and 56 is low and thereby the MOS transistors 66 and 72 cannot be satisfactorily driven, amplifying circuits are used as the drive circuits 58 and 64.

The operation of the third embodiment will be described starting with the PMOS transistors in the following.

When the voltage of the input signal Ain applied to the input terminal 54 is in the H level, the PMOS transistors 66 and 76 are in off state. At that time, since the signal from the inverter 74 is in the L level, the PMOS transistor 78 is in on state. Thus, since the gate of the PMOS transistor 68 is in the H level, the PMOS transistor 68 is in off state.

When the input signal Ain is in the L level, the PMOS transistors 66 and 76 are in on state. At that time, since the signal from the inverter 74 is in the H level, the PMOS transistor 78 is in off state. Thus, output signal ABout which is output to the output terminal 52 is sent to the gate of the PMOS transistor 68. Thus, the PMOS transistors 66 and 68 cause the output signal ABout to be increased toward the power supply voltage $V_{DD}$. When the voltage of the output signal About increases higher than $(V_{DD}-|V_{THP}|)$, the PMOS transistor 68 is turned off. In other words, when the voltage of the output signal ABout is low, both the PMOS transistors 66 and 68 are in on state. Thus, the voltage of the output signal ABout is increased rapidly toward the power voltage $V_{DD}$. As the voltage of the output signal ABout increases, the gate voltage of the PMOS transistor 68 also increases. Thus, the drive performance of the PMOS transistor 68 gradually becomes weak. When the voltage of the output signal ABout increases higher than $(V_{DD}-|V_{THP}|)$, the PMOS transistor 68 is completely turned off. At that time, while only the PMOS transistor 66 is in on state causing the voltage of the output signal ABout to be increased to the power supply voltage, when the current drive performance of the PMOS transistors 66 and 68 are set to a particular level, the speed of the rising output signal ABout can be increased with reducing the overshoot.

The operation of the NMOS transistors will be described in the following.

When input signal Bin which is applied to the input terminal 56 is in the L level, the NMOS transistors 72 and 82 are in off state. At that time, since the output signal of the inverter 80 is in the H level, the NMOS transistor 84 is in on state. Thus, since the gate voltage of the NMOS transistor 70 is in the L level, the NMOS transistor 70 is in off state.

When the input signal Bin is in the H level, the NMOS transistors 72 and 82 are in on state. At that time, since the output signal of the inverter 80 is in the L level, the NMOS transistor 84 is in off state. Thus, the output signal ABout is applied to the gate of the NMOS transistor 70. Consequently, the NMOS transistors 70 and 72 causes the voltage of the output signal ABout to be decreased toward the ground voltage. When the voltage of the output signal ABout decreases lower than the threshold voltage $V_{THN}$ of the NMOS transistor 70, the transistor 70 is turned off. In other words, when the voltage of the output signal ABout is high, both the NMOS transistors 70 and 72 are in on state. Thus, they causes the voltage of the output signal ABout to be decreased rapidly toward the ground voltage. As the voltage of the output signal ABout decreases, the gate voltage of the NMOS transistor 70 also decreases. Thus, the drive performance of the NMOS transistor 70 gradually becomes weak. When the voltage of the output signal ABout decreases lower than the threshold voltage $V_{THN}$ of the NMOS transistor 70, the transistor is completely turned off. At that time, only the NMOS transistor 72 is in on state causing the voltage of the output signal ABout to be decreased toward the ground voltage. Thus, when the current drive performance of the NMOS transistors 72 and 70 is set to a particular level, the through rate of the output signal can be increased with preventing the undershoot from taking place.

When same signals are input as input signals Ain and Bin, one of the inverters 74 and 80 can be omitted. For example, the signal where Ain or Bin is inverted can be used as the gate input signal of the PMOS transistor 78 and the NMOS transistor 84.

Figure 7:
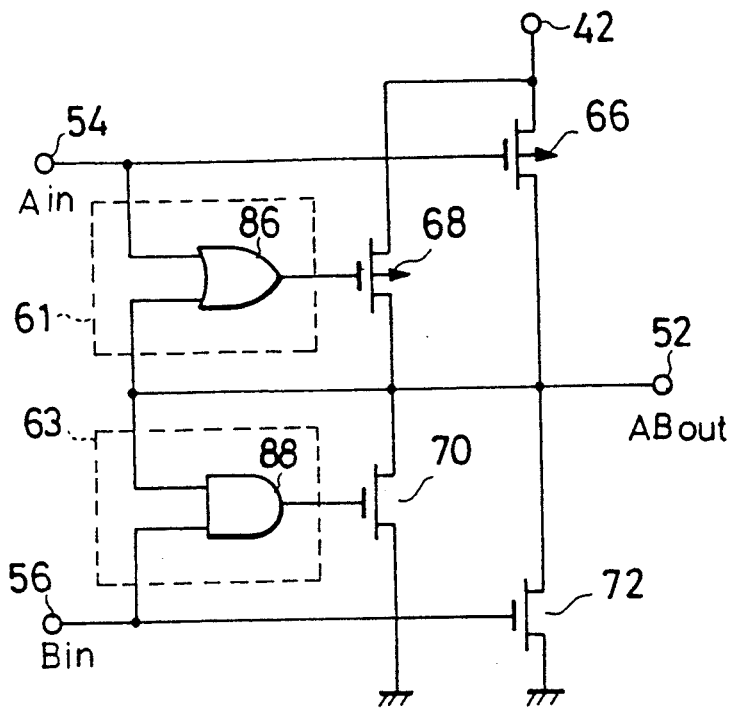
FIG. 7 schematically shows an electrical structure of a fourth embodiment of an output circuit according to the present invention.

FIG. 7 schematically shows a fourth embodiment of the present invention.

The structure and the operation of the fourth embodiment are similar to those of the third embodiment shown in FIG. 6, except that an OR gate 86 and an AND gate 88 are used as the drive circuits shown by the dot line sections 61 and 63, respectively.

Figure 8:
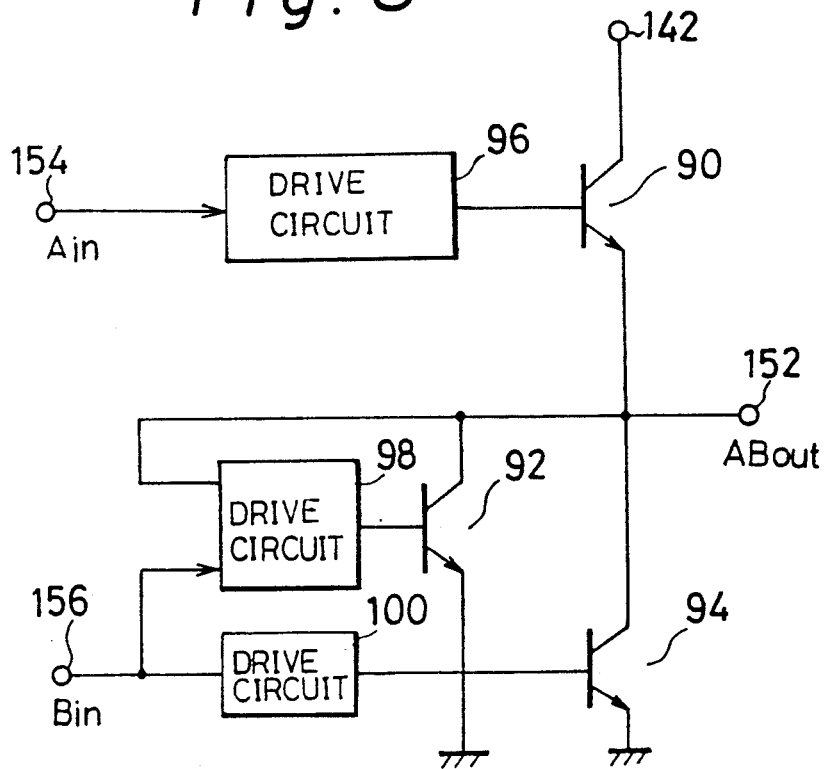
FIG. 8 schematically shows an electrical structure of a fifth embodiment of an output circuit according to the present invention.

FIG. 8 schematically shows a fifth embodiment of the present invention. In the fifth embodiment, bipolar transistors are used as output drive transistors.

As shown in FIG. 8 the output circuit of the fifth embodiment is constituted by combination of supply terminal 142 for the power supply voltage $V_{CC}$, input terminals 154 and 156, NPN bipolar transistors 90, 92, and 94, a base drive circuit 96, base drive circuits 98 and 100, and an output terminal 152.

The input terminal 154 is connected to a base of the NPN transistor 90 through the base drive circuit 96 for driving the output signal on the power supply side. An emitter of the NPN transistor 90 is connected to the output terminal 152. The input terminal 156 is connected to the drive circuits 98 and 100. The output terminals of the drive circuits 98 and 100 are connected to bases of the transistors 92 and 94, respectively. Emitters of the NPN bipolar transistors 92 and 94 are connected to ground. Collectors of the two NPN bipolar transistors 92 and 94 are connected to the output terminal 152. The output terminal 152 is also connected to the base drive circuit 98. To the drive circuit 98 two input signals are applied. One is the input signal Bin which is applied to the input terminal 156, and the other is the output signal ABout which is output to the output terminal 152. The drive circuit 98 controls base current of the NPN bipolar transistor 92.

Figure 9:
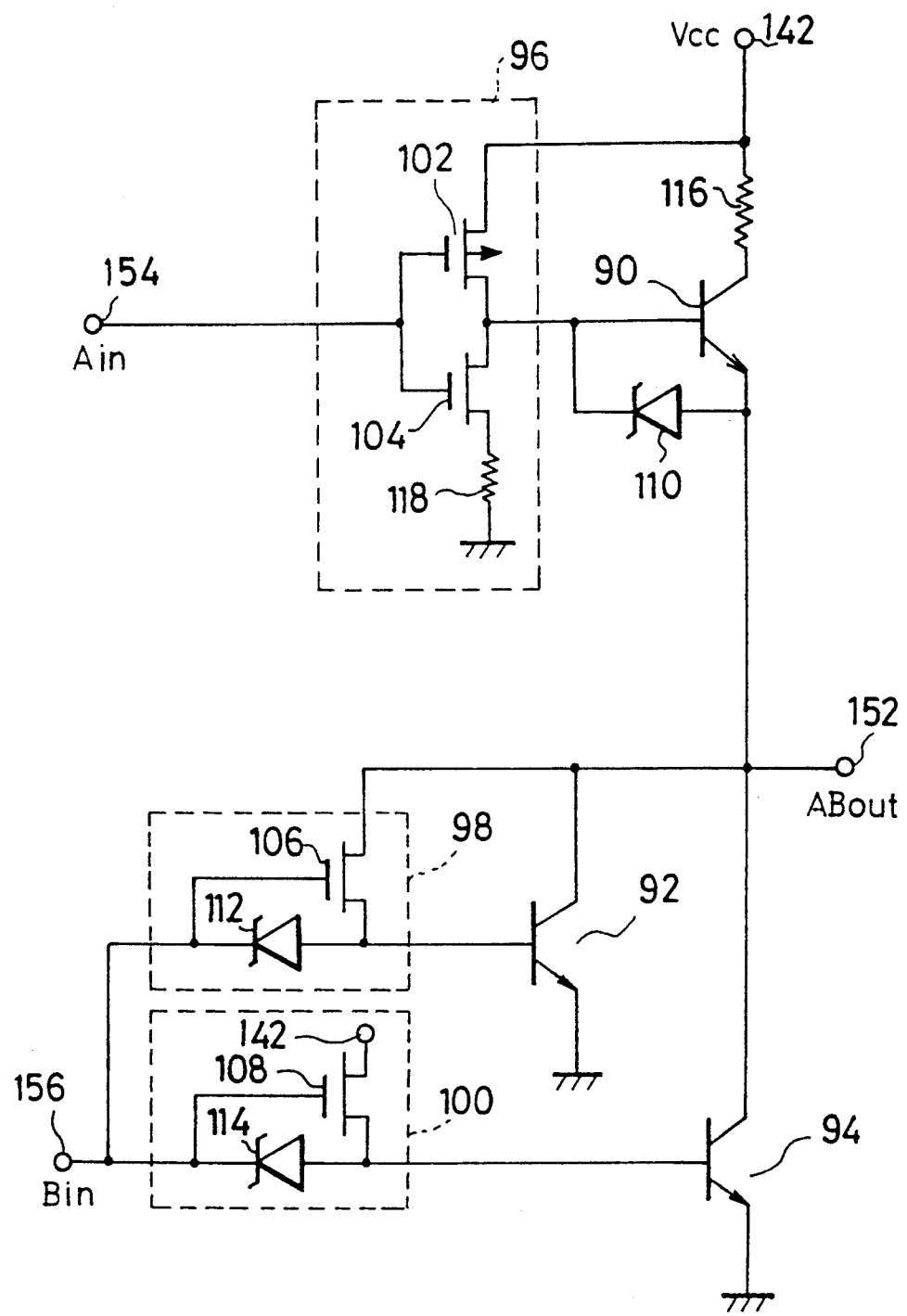
FIG. 9 shows detail circuit of the fifth embodiment shown in FIG. 8.

FIG. 9 is a detail circuit of the fifth embodiment shown in FIG. 8. As shown in FIG. 9, the drive circuits for driving the bipolar transistors are structured with CMOS transistors. The output circuit of this embodiment is formed by BiCMOS transistor technology.

The drive circuit 96 has a PMOS transistor 102, an NMOS transistor 104, and a resister 118. A collector of the NPN transistor 90 is connected to the resister 116. A Schottky diode 110 is placed between the base and the emitter of the NPN transistor 90. The drive circuit 98 has an NMOS transistor 106 and a Schottky diode 112. The drive circuit 100 has an NMOS transistor 108 and a Schottky diode 114.

The output signal ABout at the output terminal 152 is applied to the NPN bipolar transistor 92 through the NMOS transistor 106 to control base current thereof. In other words, when the voltage of the output signal ABout is lower than that between the base and the emitter of the NPN bipolar transistor 92, the NPN bipolar transistor 92 is in off state and thereby preventing the undershoot of the output signal ABout from taking place.

The control with respect to the H level of the output signal ABout is conducted by the base drive circuit 96 using the NPN transistor 90. Since this circuit basically tends to be free of the overshoot, the output circuit of the fifth embodiment is not provided with the countermeasure against the overshoot.

Figure 10:
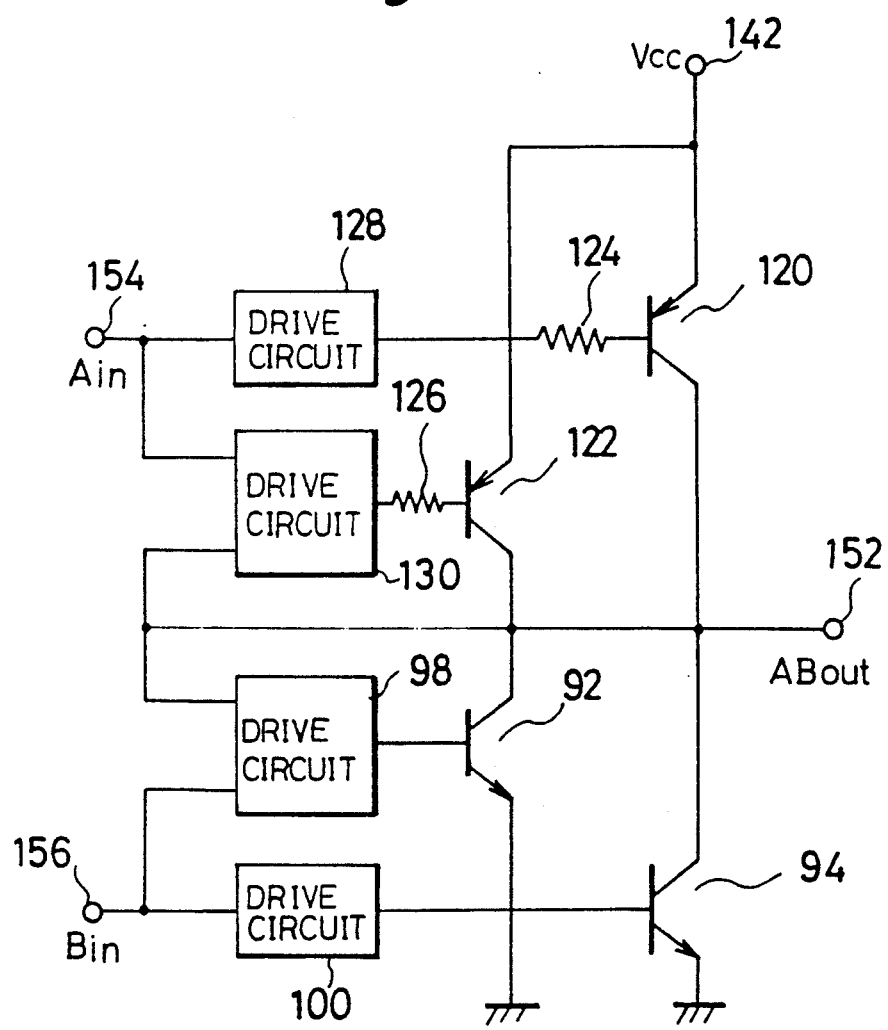
FIG. 10 schematically shows an electrical structure of a sixth embodiment of an output circuit according to the present invention.

FIG. 10 schematically shows a sixth embodiment of the present invention. The output circuit of the sixth embodiment uses PNP transistors and NPN transistors as high voltage output drive transistors and low voltage output drive transistors, respectively.

As shown in FIG. 10, this output circuit is constituted by PNP transistors 120 and 122, NPN transistors 92 and 94, resisters 124 and 126 for limiting the base current, base drive circuits 98, 100, 128, and 130, a supply terminal 142 for the power voltage $V_{CC}$, input terminals 154 and 156, and an output terminal 152.

The drive circuit 130 on the high voltage output drive section receives an input signal Ain applied to the input terminal 154 and an output signal ABout and drives the PNP transistor 122. The NPN bipolar transistors 92 and 94 and the drive circuits 98 and 100 on the low voltage output drive side are the same as those of the fifth embodiment shown in FIG. 8.

When the output signal ABout is in the L level and the effective input signal Ain is applied to the input terminal 154, both the PNP transistors 120 and 122 are in on state. However, when the voltage of the output signal ABout is close to the power voltage $V_{CC}$, the base drive circuit 130 causes the PNP transistor 122 to be in off state. Thus, the structure where the overshoot does not easily take place can be accomplished.

Figure 11:
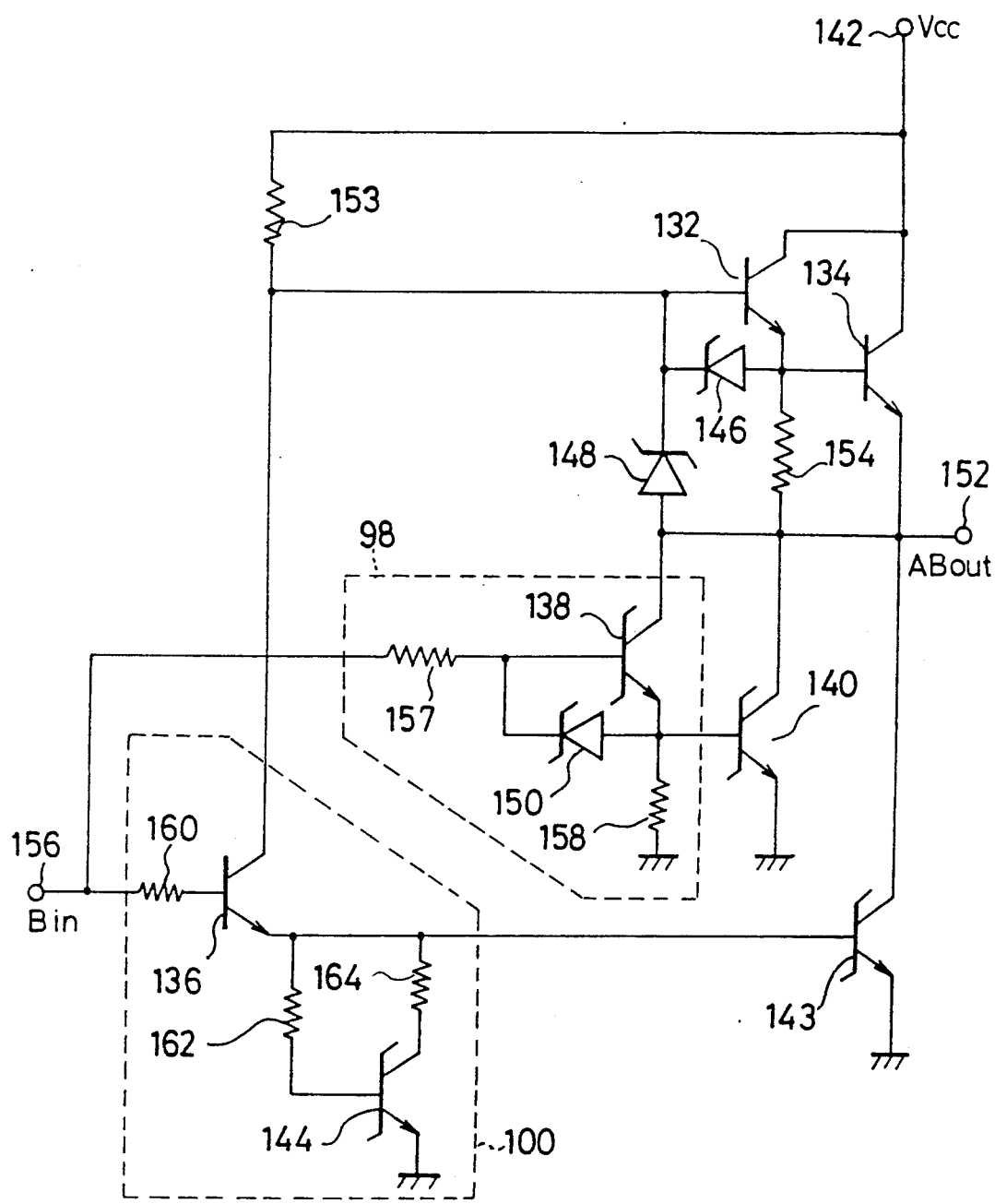
FIG. 11 schematically shows an electrical structure of a seventh embodiment of an output circuit according to the present invention.

FIG. 11 schematically shows a seventh embodiment of the present invention. The output circuit of the seventh embodiment uses a bipolar integrated circuit.

As shown in FIG. 11, the high voltage output drive section of the output circuit of the seventh embodiment has NPN transistors 132 and 134, Schottky barrier diodes 146 and 148, and resistors 153 and 154. The low voltage output drive section has Schottky NPN transistors 140 and 143 connected in parallel, and their base drive circuits 98 and 100. The drive circuit 98 has a Schottky NPN transistor 138, a Schottky barrier diode 150, and resistors 157 and 158. The drive circuit 100 has a Schottky NPN transistor 144, an NPN transistor 136, and resisters 160, 162 and 164.

When the input signal Bin applied to the input terminal 56 is in the L level, both the Schottky NPN transistor 138 and the NPN transistor 136 are in off state. In addition, both the Schottky NPN transistors 140 and 143 are in off state. When the input signal Bin is in the H level, both the Schottky NPN transistor 138 and the NPN transistor 136 are in on state. In addition, the Schottky NPN transistor 143 is also in on state. On the other hand, since the collector of the Schottky NPN transistor 138 is connected to the output terminal 152, when the voltage of the output signal ABout decreases, the Schottky NPN transistor 140 is automatically turned off. Thus, the undershoot can be prevented.

Many widely different embodiments of the present invention may be constructed without departing from the spirit and scope of the present invention. It should be understood that the present invention is not limited to the specific embodiments described in the specification, except as defined in the appended claims.

What is claimed is:

1. An output circuit for simiconductor integrated circuit comprising:

an input terminal;
an output terminal;
a supply terminal for supplying a power supply voltage or a ground voltage;
first and second MOS transistors, each having one terminal thereof coupled to said supply terminal, second terminals thereof being coupled to said output terminal;
a first drive circuit, coupled to said input terminal and to said first transistor, for turning on said first transistor when voltage of said input terminal is in a different logical level from voltage of said supply terminal; and
a second drive circuit, coupled to said input terminal, to said output terminal, and to said second transistor, for turning on said second transistor when voltage of said input terminal is in a different logical level from the voltage of said supply terminal, said second drive circuit turning off said second transistor when voltage of said output terminal is in the range between a predetermined threshold voltage and the voltage of said supply terminal.

2. An output circuit as claimed in claim 1, wherein said first and second transistors are PMOS transistors, drains and sources thereof being connected to said output terminal and said supply terminal for supplying a power supply voltage, respectively.

3. An output circuit as claimed in claim 1, wherein said first and second transistors are NMOS transistors, drains and sources thereof being connected to said output terminal and said supply terminal for supplying a ground voltage, respectively.

4. An output circuit for semiconductor integrated circuit comprising:
an input terminal;
an output terminal;
a supply terminal for supplying a power supply voltage;
first and second PNP transistors, collectors and emitters thereof being connected to said output terminal and said supply terminal for supplying a power supply voltage, respectively;
a first drive circuit, coupled to said input terminal and to said first transistor, for turning on said first transistor when a voltage of said input terminal is in a different logical level from voltage of said supply terminal; and
a second drive circuit, coupled to said input terminal, to said output terminal and to said second transistor, for turning on said second transistor when a voltage of said input terminal is in a different logical level from the voltage of said supply terminal, said second drive circuit turning off said second transistor when voltage of said output terminal is in the range between a predetermined threshold voltage and the voltage of said supply terminal.

5. An output circuit as claimed in claim 4, wherein said second drive circuit for driving said second PNP transistor is formed by means of MOS transistor technology.

6. An output circuit as claimed in claim 4, wherein said second drive circuit for driving said second PNP transistor is formed by means of BiMOS transistor technology.

7. An output circuit as claimed in claim 4, wherein said second drive circuit for driving said second PNP transistor is formed by means of bipolar transistor technology.

8. An output circuit for semiconductor integrated circuit comprising:
an input terminal;
an output terminal;
a supply terminal for supplying a ground voltage;
first and second NPN transistors, collectors and emitters thereof being connected to said output terminal and said supply terminal for supplying a ground voltage, respectively;
a first drive circuit, coupled to said input terminal and to said first transistor, for turning on said first transistor when a voltage of said input terminal is in a different logical level from voltage of said supply terminal; and
a second drive circuit, coupled to said input terminal, to said output terminal and to said second transistor, for turning on said second transistor when a voltage of said input terminal is in a different logical level from the voltage of said supply terminal, said second drive circuit turning off said second transistor when voltage of said output terminal is in the range between a predetermined threshold voltage and the voltage of said supply terminal.

9. An output circuit as claimed in claim 8, wherein said second drive circuit for driving said second NPN transistor is formed by means of MOS transistor technology.

10. An output circuit as claimed in claim 8, wherein said second drive circuit for driving said second NPN transistor is formed by means of BiMOS transistor technology.

11. An output circuit as claimed in claim 8, wherein said second drive circuit for driving said second NPN transistor is formed by means of bipolar transistor technology.

12. An output circuit for semiconductor integrated circuits comprising:
first and second input terminals;
an output terminal;
a power voltage terminal for supplying a power supply voltage;
a ground voltage terminal for supplying ground voltage;
first and second transistors, each having one terminal thereof coupled to said power voltage terminal, other terminal thereof being coupled to said output terminal;
a first drive circuit, coupled to said first input terminal and to said first transistor, for turning on said first transistor when voltage of said first input terminal is in a different logical level from the power supply voltage;
a second drive circuit, coupled to said first input terminal, to said output terminal, and to said second transistor, for turning on said second transistor when voltage of said first input terminal is in a different logical level from the power supply voltage, said second drive circuit turning off said second transistor when voltage of said output terminal is in the range between a predetermined threshold voltage and the power supply voltage;
third and fourth transistors each having one terminal thereof coupled to said ground voltage terminal, the other terminal thereof being coupled to said output terminal;
a third drive circuit, coupled to said second input terminal and to said third transistor, for turning on said third transistor when voltage of said second input terminal is in a different logical level from the ground voltage; and a fourth drive circuit, coupled to said second input terminal, to said output terminal, and to said fourth transistor, for turning on said fourth transistor when voltage of said second input terminal is in a different logical level from the ground voltage, said fourth drive circuit turning off said fourth transistor when voltage of said output terminal is in the range between a predetermined threshold voltage and the ground voltage.

13. An output circuit as claimed in claim 12, wherein said first to fourth transistors are MOS transistors.

14. An output circuit as claimed in claim 13, wherein said first and second transistor are PMOS transistors, drain and source thereof being connected to said output terminal and said power voltage terminal, respectively, said third and fourth transistors being NMOS transistors, drain and source thereof being connected to said output terminal and the ground voltage terminal, respectively.

15. An output circuit as claimed in claim 12, wherein said first to fourth transistors are bipolar transistors.

16. An output circuit as claimed in claim 15, wherein said first and second transistors are PNP transistors, collector and emitter thereof being connected to said output terminal and said power voltage terminal, respectively, said third and fourth transistor being NPN transistors, collector and emitter thereof being connected to said output terminal and the ground voltage terminal, respectively.

17. An output circuit as claimed in claim 15, wherein said third and fourth transistor are Schottky NPN transistors, collector and emitter thereof being connected to said output terminal and the ground voltage terminal, respectively.

* * * * *